(12) United States Patent
Tak et al.

(10) Patent No.: US 10,176,989 B2
(45) Date of Patent: Jan. 8, 2019

(54) METHOD OF MANUFACTURING INTEGRATED CIRCUIT DEVICE

(71) Applicant: SAMSUNG ELECTRONICS CO., LTD., Suwon-si, Gyeonggi-do (KR)

(72) Inventors: Yong-suk Tak, Seoul (KR); Min-jae Kang, Osan-si (KR); Ju-ri Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/706,842

(22) Filed: Sep. 18, 2017

(65) Prior Publication Data

US 2018/0286676 A1   Oct. 4, 2018

(30) Foreign Application Priority Data

Mar. 29, 2017 (KR) .................. 10-2017-0039952

(51) Int. Cl.
| | |
|---|---|
| H01L 21/02 | (2006.01) |
| C23C 16/458 | (2006.01) |
| C23C 16/34 | (2006.01) |
| C23C 16/455 | (2006.01) |
| H01L 21/28 | (2006.01) |
| H01L 21/8238 | (2006.01) |
| H01L 29/49 | (2006.01) |
| H01L 29/51 | (2006.01) |

(52) U.S. Cl.
CPC ...... *H01L 21/02656* (2013.01); *C23C 16/345* (2013.01); *C23C 16/347* (2013.01); *C23C 16/458* (2013.01); *C23C 16/45531* (2013.01); *C23C 16/45542* (2013.01); *H01L 21/28088* (2013.01); *H01L 21/823842* (2013.01); *H01L 29/4966* (2013.01); *H01L 29/517* (2013.01)

(58) Field of Classification Search
CPC ......... H01L 21/02656; C23C 16/45542; C23C 16/347; C23C 16/345
See application file for complete search history.

(56) References Cited

U.S. PATENT DOCUMENTS

| | | |
|---|---|---|
| 4,810,526 A | 3/1989 | Ito et al. |
| 7,563,715 B2 | 7/2009 | Haukka et al. |
| 8,557,716 B2 | 10/2013 | Mizuno |
| 8,647,993 B2 | 2/2014 | LaVoie et al. |
| 9,123,530 B2 | 9/2015 | Ota et al. |

(Continued)

*Primary Examiner* — Jay C Chang
*Assistant Examiner* — Mikka Liu
(74) *Attorney, Agent, or Firm* — Lee & Morse, P.C.

(57) ABSTRACT

A method of manufacturing an integrated circuit device and an integrated circuit device prepared according to the method, the method including forming a silicon oxycarbonitride (SiOCN) material layer on an active region of a substrate, the forming the SiOCN material layer including using a precursor that has a bond between a silicon (Si) atom and a carbon (C) atom; etching a portion of the active region to form a recess in the active region; baking a surface of the recess at about 700° C. to about 800° C. under a hydrogen ($H_2$) atmosphere, and exposing the SiOCN material layer to the atmosphere of the baking while performing the baking; and growing a semiconductor layer from the surface of the recess baked under the hydrogen atmosphere.

18 Claims, 18 Drawing Sheets

(56) References Cited

U.S. PATENT DOCUMENTS

| | | | |
|---|---|---|---|
| 2013/0105861 A1* | 5/2013 | Liao | H01L 21/823412 257/192 |
| 2015/0147483 A1 | 5/2015 | Fukazawa | |
| 2015/0147484 A1 | 5/2015 | Nguyen et al. | |
| 2015/0206955 A1* | 7/2015 | Kim | H01L 29/66795 438/285 |
| 2015/0252477 A1 | 9/2015 | Nguyen et al. | |
| 2015/0303056 A1* | 10/2015 | Varadarajan | H01L 21/02167 438/790 |
| 2016/0002039 A1 | 1/2016 | Thompson | |
| 2016/0276148 A1 | 9/2016 | Qian et al. | |

\* cited by examiner

METHOD OF MANUFACTURING INTEGRATED CIRCUIT DEVICE

CROSS-REFERENCE TO RELATED APPLICATION

Korean Patent Application No. 10-2017-0039952, filed on Mar. 29, 2017, in the Korean Intellectual Property Office, and entitled: "Method of Manufacturing Integrated Circuit Device," is incorporated by reference herein in its entirety.

BACKGROUND

1. Field

Embodiments relate to a method of manufacturing an integrated circuit device.

2. Description of the Related Art

Downscaling of semiconductor devices has been progressing rapidly due to the development of electronic technology, and a low dielectric layer having a relatively low dielectric constant may be used as an insulating layer for securing insulation between adjacent conductive regions, even if an area of the semiconductor devices is reduced due to the downscaling of the semiconductor devices.

SUMMARY

The embodiments may be realized by providing a method of manufacturing an integrated circuit device, the method including forming a silicon oxycarbonitride (SiOCN) material layer on an active region of a substrate, the forming the SiOCN material layer including using a precursor that has a bond between a silicon (Si) atom and a carbon (C) atom; etching a portion of the active region to form a recess in the active region; baking a surface of the recess at about 700° C. to about 800° C. under a hydrogen ($H_2$) atmosphere, and exposing the SiOCN material layer to the atmosphere of the baking while performing the baking; and growing a semiconductor layer from the surface of the recess baked under the hydrogen atmosphere.

The embodiments may be realized by providing a method of manufacturing an integrated circuit device, the method including etching a portion of a substrate to form a fin-type active region; forming a silicon oxycarbonitride (SiOCN) material layer that covers the fin-type active region on the substrate, the forming the SiOCN material layer including using a precursor that has a bond between a silicon (Si) atom and a carbon (C) atom and that does not have a Si—Si bond; etching a portion of the fin-type active region while etching the SiOCN material layer to form a recess in the fin-type active region while forming a gate insulating spacer from the SiOCN material layer on the fin-type active region; baking a surface of the recess at about 700° C. to about 800° C. under a hydrogen ($H_2$) atmosphere, and exposing the gate insulating spacer to the atmosphere of the baking while performing the baking; and growing a semiconductor layer from the surface of the recess baked under the hydrogen atmosphere.

The embodiments may be realized by providing a method of manufacturing an integrated circuit device, the method including providing a substrate that has an active region; forming a silicon oxycarbonitride (SiOCN) material layer on the active region of the substrate such that the SiOCN material layer is formed using a precursor that has a direct bond between a silicon (Si) atom and a carbon (C) atom thereof; etching a portion of the active region to form a recess in the active region; baking a surface of the recess at about 700° C. to about 800° C. under a hydrogen ($H_2$) atmosphere such that the SiOCN material layer is exposed to the atmosphere of the baking while performing the baking; and growing a semiconductor layer from the baked surface of the recess.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
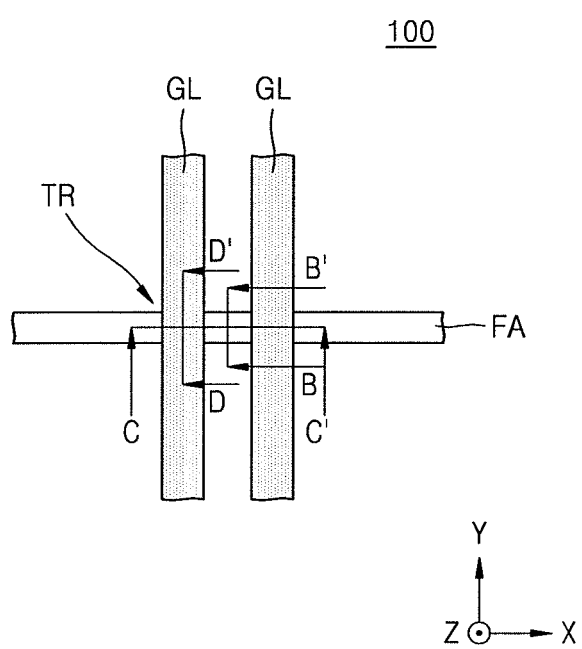
FIG. 1 illustrates a planar layout diagram of main components of an integrated circuit device manufactured according to example embodiments.

FIG. 1 illustrates a planar layout diagram of main components of an integrated circuit device 100 manufactured according to example embodiments.

Referring to FIG. 1, the integrated circuit device 100 may include a fin-type for fin-shaped active region FA extending in a first direction (X direction) and a plurality of gate lines GL extending in a second direction (Y direction) crossing the fin-type active region FA. A transistor TR may be formed at portions where the fin-type active region FA and the plurality of gate lines GL cross each other, respectively.

Figure 2A:
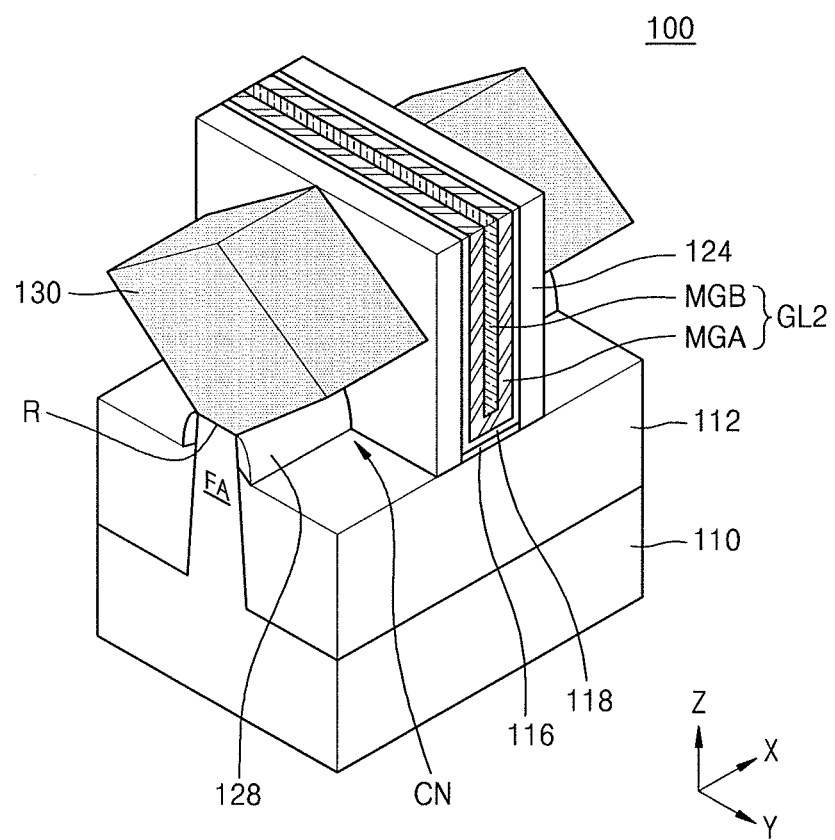
FIG. 2A illustrates a perspective view of main components in a portion of FIG. 1.
Figure 2B:
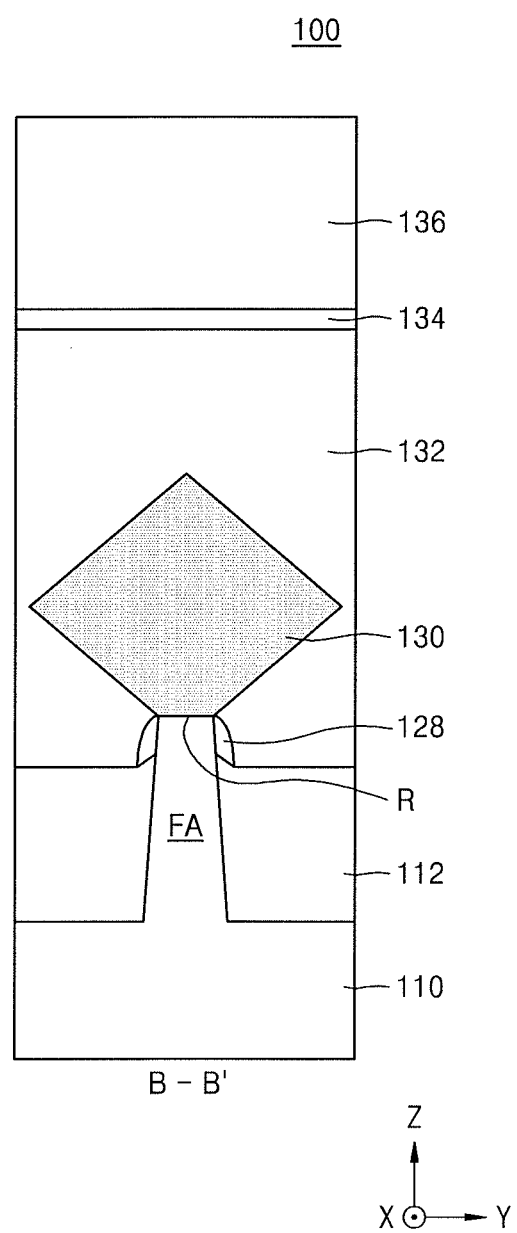
FIG. 2B illustrates a cross-sectional view taken along line B-B' of FIG. 1.
Figure 2C:
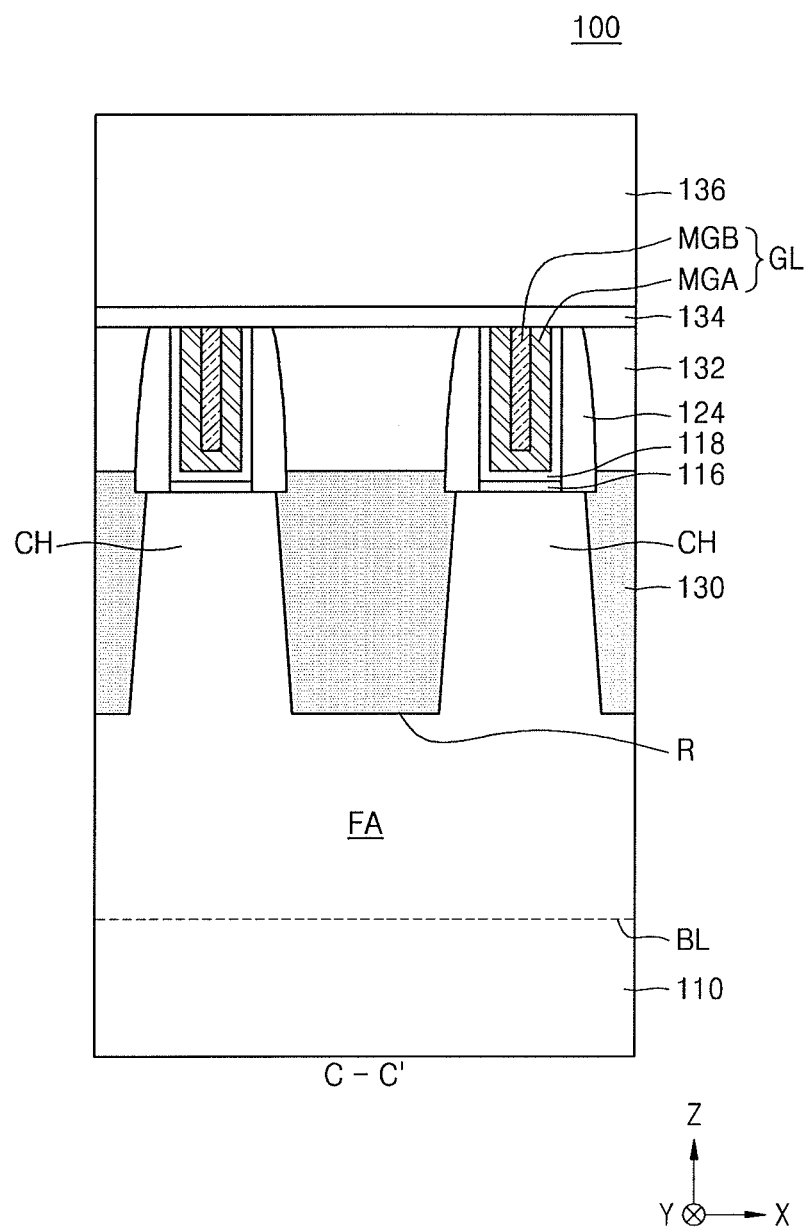
FIG. 2C illustrates a cross-sectional view taken along line C-C' of FIG. 1.
Figure 2D:
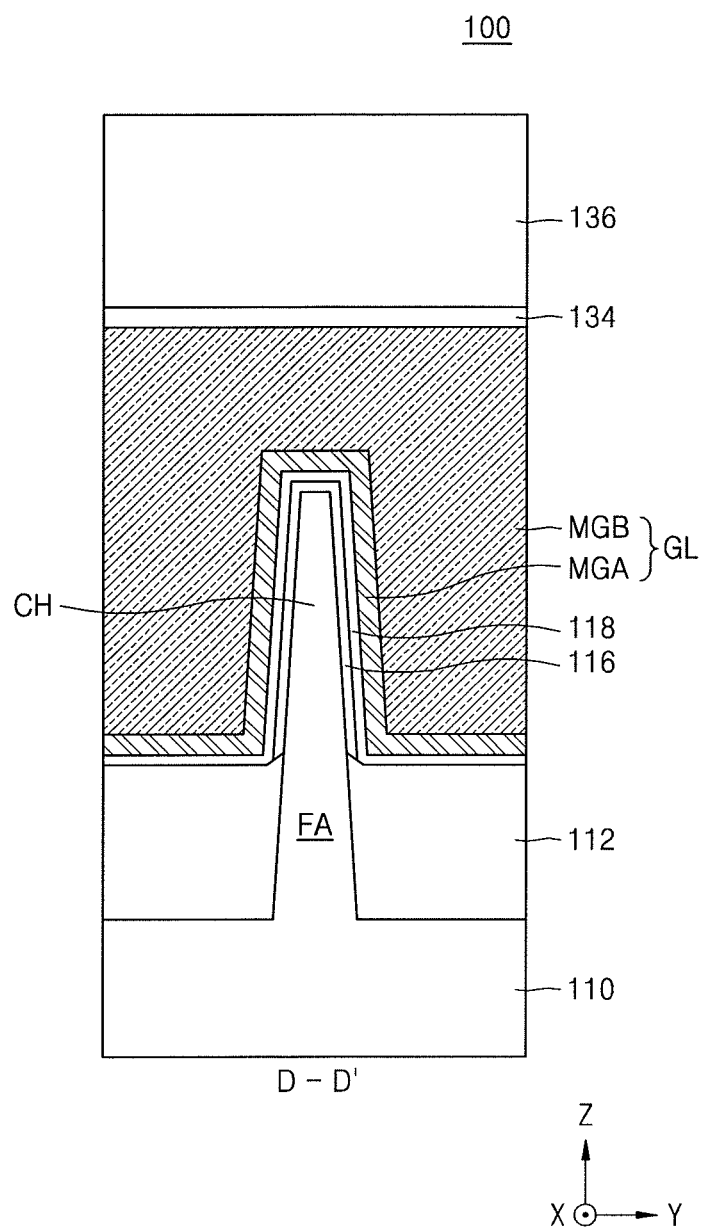
FIG. 2D illustrates a cross-sectional view taken along line D-D' of FIG. 1.

FIG. 2A illustrates a perspective view of main components in a portion of FIG. 1. FIG. 2B illustrates a sectional view taken along line B-B' of FIG. 1. FIG. 2C illustrates a cross-sectional view taken along line C-C' of FIG. 1. FIG. 2D illustrates a cross-sectional view taken along line D-D' of FIG. 1.

Referring to FIGS. 2A to 2D, the integrated circuit device 100 may include the fin-type active region FA protruding from a substrate 110. In FIG. 2C, a lowest level of the fin-type active area FA is indicated by a dotted line BL.

The substrate 110 may include a semiconductor, e.g., silicon (Si) or germanium (Ge), or a compound semiconductor, e.g., silicon germanium (SiGe), silicon carbide (SiC), gallium arsenide (GaAs), indium arsenide (InAs), or indium phosphide (InP). The substrate 110 may include a conductive area, e.g., a well doped with impurities or a structure doped with impurities. A channel region CH of the fin-type active region FA may include Si, Ge, or a combination thereof.

As illustrated in FIGS. 2B and 2D, a lower portion of sidewalls, e.g., both sidewalls, of the fin-type active region FA may be covered with a device isolation layer 112 formed on the substrate 110, and the fin-shaped channel region CH may protrude from the device isolation layer 112 in a direction (Z direction) that is perpendicular to a main surface (X-Y plane) of the substrate 110. The channel region CH may be covered with an interface layer 116. A gate insulating layer 118 and a gate line GL may extend over the interface layer 116 in a direction crossing the fin-type active region FA while covering the channel region CH. The gate insulating layer 118 and the gate line GL may extend while covering an upper surface and both sidewalls of the fin-type active region FA and the device isolation layer 112. The transistor TR may be formed at a point where the fin-type active region FA and the gate line GL cross each other. The transistor TR may be a MOS transistor having a 3D structure in which a channel is formed on the upper surface and both sidewalls of the fin-type active region FA.

The interface layer 116 may be obtained by oxidizing exposed surfaces of the fin-type active region FA. The interface layer 116 may include a low dielectric material layer having a dielectric constant of 9 or less, e.g., a silicon oxide layer, a silicon oxynitride layer, or a combination thereof. The gate insulating layer 118 may include a silicon oxide layer, a high dielectric layer, or a combination thereof. The high dielectric layer may include a material having a dielectric constant greater than that of a silicon oxide layer. In an implementation, the gate insulating layer 118 may have a dielectric constant of about 10 to 25. The gate insulating layer 118 may include, e.g., hafnium oxide, hafnium oxynitride, hafnium silicon oxide, lanthanum oxide, lanthanum aluminum oxide, zirconium oxide, zirconium silicon oxide, tantalum oxide, titanium oxide, or combinations thereof.

Each of the gate lines GL may include a first metal-containing layer MGA and a second metal-containing layer MGB. The first metal-containing layer MGA may help control a work function. The second metal-containing layer MGB may help fill a space formed in an upper portion of the first metal-containing layer MGA. The first metal-containing layer MGA may include, e.g., titanium (Ti), tantalum (Ta), aluminum (Al), or a combination thereof. The first metal-containing layer MGA may be a monolayer or a multilayer. The second metal-containing layer MGB may include, e.g., an upper work-function control layer, a conductive barrier layer, a gap-fill metal layer, or a combination thereof. The upper work-function control layer may include, e.g., titanium aluminum (TiAl), titanium aluminum carbon (TiAlC), titanium aluminum nitride (TiAlN), titanium carbide (TiC), tantalum carbide (TaC), hafnium silicon (HfSi), or a combination thereof. The conductive barrier layer may include a metal nitride, e.g., titanium nitride (TiN), tantalum nitride (TaN), or a combination thereof. The gap-fill metal layer may include, e.g., tungsten (W). In an implementation, at least one of the upper work-function control layer, the conductive barrier layer, and the gap-fill metal layer may be omitted. In an implementation, each of the gate lines GL may include, e.g., a stack structure of TiAlC/TiN/W, a stack structure of TiN/TaN/TiAlC/TiN/W, or a stack structure of TiN/TaN/TiN/TiAlC/TiN/W.

Both sidewalls of each of the interface layer 116, the gate insulating layer 118, and the gate lines GL may be covered with a gate insulating spacer 124. The gate insulating spacer 124 may include, e.g., a silicon oxycarbonitride (SiOCN) layer. In an implementation, the gate insulating spacer 124 may include a silicon nitride (SiN) layer covering sidewalls of the gate line GL and the SiOCN layer covering the sidewalls of the gate line GL with the SiN layer therebetween.

A recess R may be formed on both sides of the gate line GL in the fin-type active region FA, and the recess R may be filled with a source/drain region 130. The source/drain region 130 and the gate line GL may be insulated from each other by the gate insulating spacer 124 interposed therebetween. The source/drain region 130 may include a semiconductor layer that is epitaxially grown from a surface of the fin-type active region FA forming an inner wall of the recess R. In an implementation, the source/drain region 130 may have an embedded SiGe structure that includes a plurality of epitaxially grown SiGe layers. The plurality of SiGe layers may have different Ge contents. In an implementation, the source/drain region 130 may include an epitaxially grown Si layer, or an epitaxially grown SiC layer. Each of FIGS. 2A to 2C shows a case where the source/drain region 130 has a specific cross-sectional shape. In an implementation, the source/drain region 130 may have various cross-sectional shapes, e.g., a polygonal shape such as a square, a pentagon, or a hexagon, a circular shape, or an oval shape.

An inter-gate insulating layer 132 may be interposed between each of the plurality of gate lines GL. The inter-gate insulating layer 132 may cover the source/drain region 130 between the plurality of gate lines GL. The inter-gate insulating layer 132 may include, e.g., a silicon oxide layer.

Both sidewalls of a portion of the fin-type active region FA (adjacent to where the recess R is formed) may be covered with a fin insulating spacer 128. The fin insulating spacer 128 may include the same material as the material of the gate insulating spacer 124. In an implementation, the gate insulating spacer 124 and the fin insulating spacer 128 may include, e.g., a SiOCN material layer. The gate insulating spacer 124 and the fin insulating spacer 128 may be integrally connected to each other. In an implementation, the gate insulating spacer 124 and the fin insulating spacer 128 may be integrally connected to each other in a reentrant corner portion CN (see FIG. 2A) formed between the gate line GL and the fin-type active region FA. In an implementation, the fin insulating spacer 128 may be omitted.

A blocking insulating layer 134 may be formed on the plurality of gate lines GL and the inter-gate insulating layer 132. The blocking insulating layer 134 may help reduce or prevent undesired foreign materials such as oxygen from penetrating into the plurality of gate lines GL. The blocking insulating layer 134 may include, e.g., SiN, silicon oxynitride (SiON), SiOCN, or a combination thereof. An interlayer insulating layer 136 may be formed on the blocking insulating layer 134. In an implementation, the interlayer insulating layer 136 may include, e.g., a silicon oxide layer.

FIGS. 3A to 3J illustrate cross-sectional views of stages in a method of manufacturing the integrated circuit device 100, according to example embodiments. FIGS. 3A to 3J show main components of portions corresponding to the cross-sections taken along lines B-B' and C-C' of FIG. 1 in a process sequence. An example method of manufacturing the integrated circuit device 100 of FIGS. 1 to 2D will be described with reference to FIGS. 3A to 3J. In FIGS. 3A to 3J, the same reference numerals as in FIGS. 1 to 2D denote the same elements, and descriptions thereof will not be given herein.

Figure 3A:
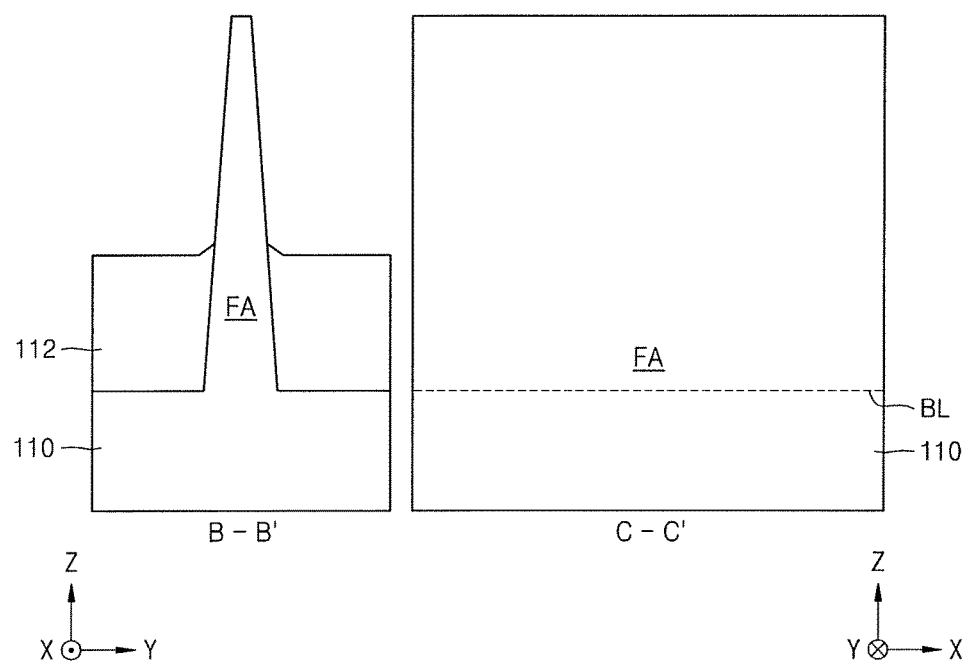
FIGS. 3A to 3J illustrate cross-sectional views of stages in a method of manufacturing an integrated circuit device, according to example embodiments.

Referring to FIG. 3A, after a substrate 110 is prepared, a portion of the substrate 110 may be etched to form the fin-type active region FA protruding upwardly (e.g., in the Z direction) from the main surface (X-Y plane) of the substrate 110 and extending in or along the first direction (X direction). In an implementation, the fin-type active region FA may include P-type or N-type impurity diffusion regions depending on a channel type of a MOS transistor to be formed.

After an insulating layer covering the fin-type active region FA is formed on the substrate 110, the insulating layer may be etched back to form the device isolation layer 112. After the device isolation layer 112 is formed, the fin-type active region FA may protrude from the device isolation layer 112 and be exposed. The device isolation layer 112 may include, e.g., a silicon oxide layer, a silicon nitride layer, a silicon oxynitride layer, or a combination thereof.

Figure 3B:
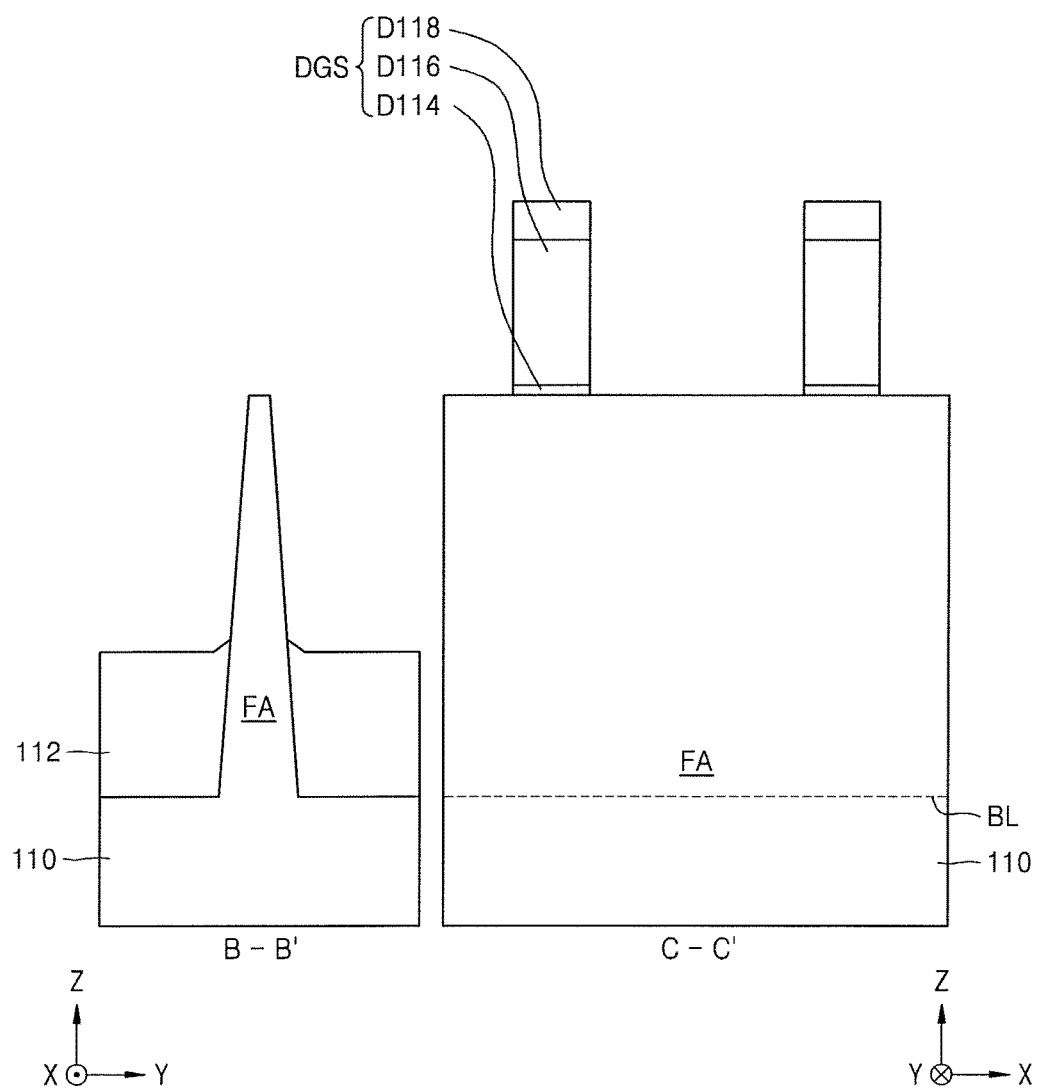

Referring to FIG. 3B, dummy gate structures DGS, which extend across the fin-type active region FA, may be formed on the fin-type active region FA. Each of the dummy gate structures DGS may include, e.g., a dummy gate insulating layer D114, a dummy gate line D116, and a dummy gate capping layer D118 that are sequentially stacked on the fin-type active region FA in this stated order. The dummy gate insulating layer D114 may include, e.g., silicon oxide. The dummy gate line D116 may include, e.g., polysilicon. The dummy gate capping layer D118 may include, e.g., at least one of silicon oxide, silicon nitride, and silicon oxynitride.

Figure 3C:
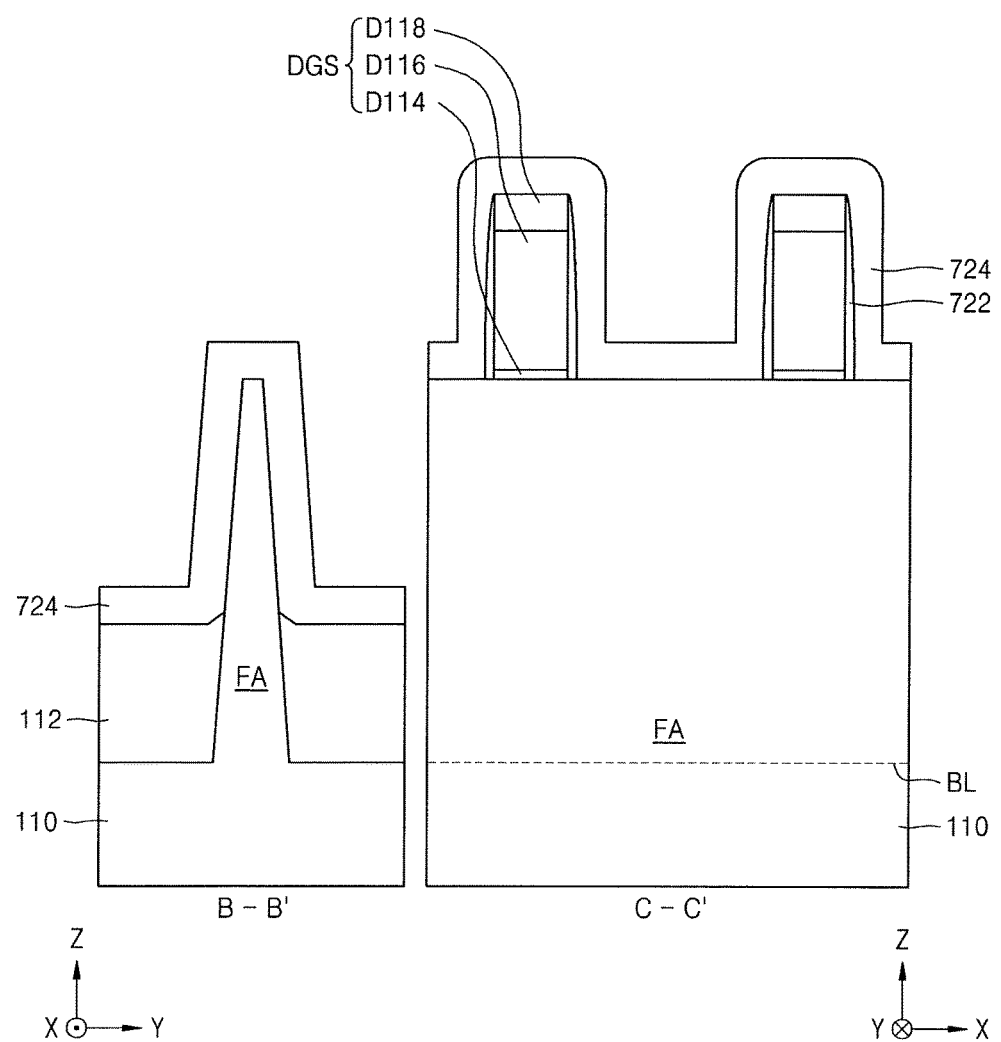

Referring to FIG. 3C, after an inner-gate insulating spacer 722 covering both sidewalls of each of the dummy gate structures DGS is formed, a spacer layer 724 covering the fin-type active region FA, the dummy gate structures DGS, and the inner-gate insulating spacer 722 may be formed. The inner-gate insulating spacer 722 may include, e.g., SiN. The spacer layer 724 may include, e.g., a SiOCN material layer. In an implementation, a silicon oxide layer conformally covering the spacer layer 724 may further be formed.

Hereinafter, a method of forming the SiOCN material layer constituting the spacer layer 724 will be described in detail with reference to FIGS. 4 to 6.

Figure 4:
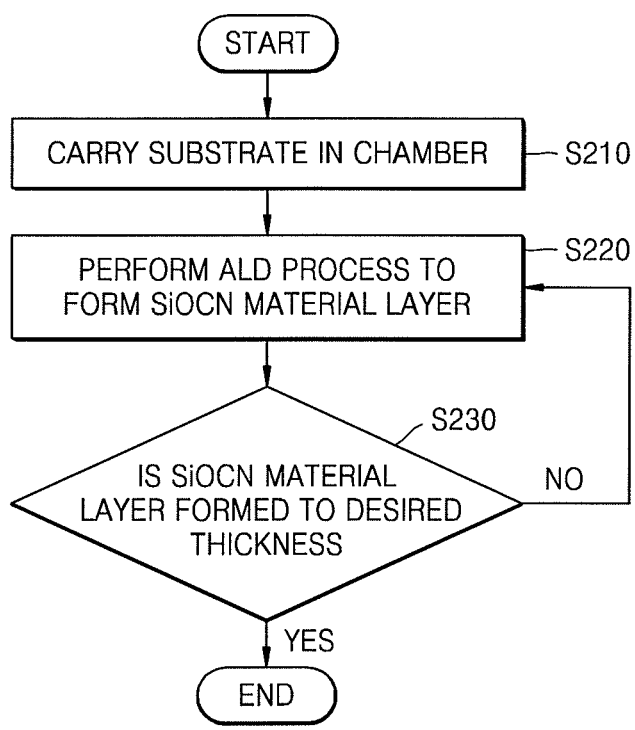
FIG. 4 illustrates a flowchart of a method of forming a silicon oxycarbonitride (SiOCN) material layer according to a method of manufacturing an integrated circuit device.

FIG. 4 illustrates a flowchart of a method of forming the SiOCN material layer in FIG. 3C according to an example embodiment.

Referring to FIG. 4, in operation S210, the substrate 110 (see FIG. 3C), over which the inner-gate insulating spacer 722 is formed, may be introduced into a chamber, e.g., a reaction chamber for performing an atomic layer deposition (ALD) process.

In operation S220, the ALD process may be performed to form the SiOCN material layer onto the substrate 110 using a precursor having a bond, e.g., a direct bond, between a silicon (Si) atom and a carbon (C) atom. In an implementation, in addition to the precursor having the bond between Si atom and C atom, source materials for forming the SiOCN material layer may be supplied onto the reaction chamber.

In operation S230, it may be determined whether the SiOCN material layer is formed to a desired thickness, and operations S220 and 230 may be repeatedly performed until a SiOCN material layer having a desired thickness is obtained. Once the SiOCN material layer of the desired thickness has been formed, the ALD process may be terminated and the substrate 110 may be carried out from the reaction chamber.

In an implementation, the ALD process for forming the SiOCN material layer may include, e.g., a plasma-enhanced ALD (PEALD) process.

Figure 5:
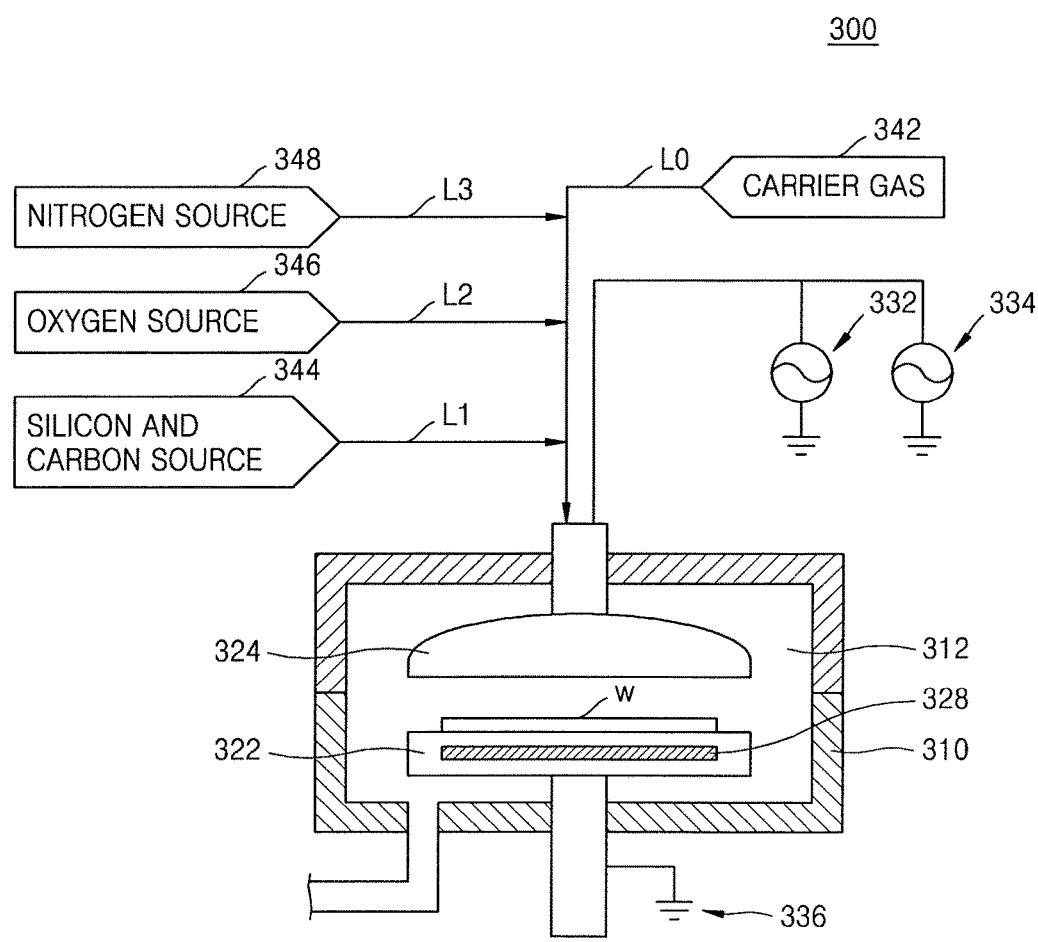
FIG. 5 illustrates a conceptual view of main components of equipment used to form a SiOCN material layer according to a method of manufacturing an integrated circuit device.

FIG. 5 illustrates a conceptual view of main components of PEALD equipment 300 used to form a SiOCN material layer, according to example embodiments.

Referring to FIG. 5, a pair of conductive flat plate electrodes 322 and 324 extending in parallel and facing each other may be provided in a reaction space 312 in a reaction chamber 310. Plasma may be generated between the pair of conductive flat plate electrodes 322 and 324 by applying an HRF power 332 of 13.56 MHz or 27 MHz and an LRF power 334 of not more than 5 MHz (e.g., 400 kHz to 500 kHz) to one of the pair of conductive flat plate electrodes 322 and 324 and applying electrical grounding 336 to the other electrode.

The lower electrode 322 of the pair of conductive flat plate electrodes 322 and 324 may support the substrate W, and a temperature controller 328 may be embedded in the lower electrode 322 to maintain the substrate W at a desired temperature. For example, as will be described below, the SiOCN material layer may be formed at a temperature of about 450° C. to about 800° C., and a temperature controller 328 may be used for this purpose.

The upper electrode 324 may function as a shower head. In an implementation, gases for forming the SiOCN material layer may be introduced into the reaction space 312 through the upper electrode 324.

A carrier gas 342 may transport sources and/or precursors for forming the SiOCN material layer into the reaction space 312. In an implementation, the carrier gas 342 may be supplied onto the reaction space 312 through a carrier gas-supply line L0 and may purge unreacted materials or reaction by-products out of the reaction space 312. In an implementation, the carrier gas 342 may be an inert gas, e.g., helium (He), neon (Ne) or the like, or gas with extremely low reactivity, e.g., nitrogen ($N_2$) or carbon dioxide ($CO_2$).

In an implementation, an identical precursor may be used as a silicon and carbon source of forming the SiOCN material layer. For example, one kind of source gas may serve as a source gas of a silicon element and also as a source gas of a carbon element without separately supplying separate precursors as a silicon source and a precursor used as a carbon source, and a deposition cycle of the ALD process for forming the SiOCN material layer may be simplified and a time taken to perform the ALD process may be shortened.

In an implementation, a precursor having a bond between Si atom and C atom may be used as a silicon and carbon source 344 of forming the SiOCN material layer.

In a method according to example embodiments, by using the precursor having the bond between Si atom and C atom as the silicon and carbon source 344 of forming the SiOCN material layer, it is possible to stably maintain the bond between Si atom and C atom in the SiOCN material layer, thereby preventing carbon atoms from being undesirably outgassed from the SiOCN material layer. Thus, a sufficient carbon content for securing sufficient etching resistance of the SiOCN material layer may be advantageously maintained.

In an implementation, in a method according to example embodiments, the precursor having the bond between Si atom and C atom as the silicon and carbon source 344 of forming the SiOCN material layer may not include a Si—Si bond, e.g., a direct bond between two silicon atoms. For example, even when a deposition process for forming the SiOCN material layer is performed at a relatively high temperature of about 500° C. or more, issues associated with thermal decomposition of a Si—Si bond may be reduced or prevented. Therefore, the ALD process may be performed easily by using the precursor having the bond between Si atom and C atom and not having a Si—Si bond during formation of the SiOCN material layer by the ALD process at a relatively high temperature.

The silicon and carbon source 344 may be introduced into the reaction space 312 through a supply line L1. The supply line L1 may merge with the carrier gas-supply line L0. In an implementation, a supply line L2 for supplying an oxygen source 346 and a supply line L3 for supplying a nitrogen source 348 may be connected to the carrier gas-supply line L0. In an implementation, the plurality of supply lines L1, L2, and L3 may be directly connected to the reaction chamber 310 independently of the carrier gas-supply line L0 supplying the carrier gas 342, respectively.

The silicon and carbon source 344, which includes the precursor having the bond between Si atom and C atom, may have a molecular weight of about 50 to about 600. In an implementation, the silicon and carbon source 344 may not include a Si—Si bond.

In an implementation, the silicon and carbon source 344 may include, e.g., a compound including a single bond between Si atom and C atom, a double bond between Si atom and C atom, or a triple bond between Si atom and C atom. In an implementation, the silicon and carbon source 344 may include a compound having at least two bonds between Si atom and C atom (e.g., a double or triple bond).

In an implementation, the silicon and carbon source 344 may be a compound represented by one of the following Formula 1 or Formula 2.

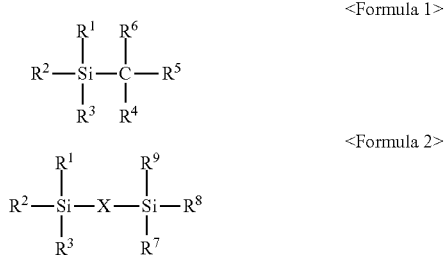

In Formulae 1 and 2, $R^1$ to $R^9$ may each independently be or include, e.g., a H atom, a Cl atom, a C1-C3 alkyl group, or a cyano group. X may be or may include, e.g., a C1-C3 alkyl group, a C2-C3 alkenyl group, a C2-C3 alkynyl group, or a carbonyl group.

Examples of the silicon and carbon source 344 formed of the compound represented by Formula 1 may include trichloromethylsilane ($CH_3SiCl_3$), dimethyldichlorosilane (($CH_3)_2SiCl_2$), and the like. In an implementation, the compounds may be available as commercial products (e.g., Sigma-Aldrich® Co, CAS No. 75-79-6 and CAS No. 75-78-5).

Examples of the silicon and carbon source 344 formed of the compound represented by Formula 2 may include 3-silylpropylsilane or 1,5-disilapentane ($C_3H_{12}Si_2$), dimethyl (methylsilyl)methylsilane ($C_3H_{12}Si_2$), dimethyl(methylsilyl)methylsilane ($C_4H_{14}Si_2$), and the like. In an implementation, the compound may be available as commercial products (e.g., ChemTik Co. Ltd., CAS No. 5654-04-6 and CAS No. 18148-13-5).

In an implementation, the silicon and carbon source 344 may be a cyclic compound in which at least one Si atom and at least one C atom together form a ring. The cyclic compound may include, e.g., at least one of a Si—C—Si bonding group and a C—Si—C bonding group therein. In an implementation, the silicon and carbon source 344 including the cyclic compound may include, e.g., 1,1-dimethyl-1,3-disiletane ($C_4H_{12}Si_2$) (for example, Chemik Co, Ltd, CAS No. 38512-90-2), 1,3-dichloro-1,3-disiletane ($C_2H_6C_{12}Si_2$) (for example, MOLBASE Inc., CAS No. 61739-69-3), 1,1-dichlorosilacyclobutane ($C_3H_6Cl_2Si$) (for example, Sigma-Aldrich®, CAS No. 2351-33-9), $C_2Si_2$) (for example, MOLBASE Inc., CAS No. 12144-09-1), 1,1,3,3-tetramethyl-1,3-disilacyclobutane ($C_6H_{16}Si_2$) (for example, Chemik Co., CAS No. 1627-98-1), or the like.

The oxygen source 346 may include, e.g., $O_3$, $H_2O$ (e.g., deionized water, purified water, and/or distilled water), $O_2$, $NO_2$, NO, $N_2$, carbon monoxide (CO), carbon dioxide ($CO_2$), alcohol, metal alkoxide, $O_2$ plasma, remote $O_2$ plasma, $N_2O$ plasma, $H_2O$ plasma, or a combination thereof. The oxygen source 346 may be introduced into the reaction space 312 at a flow rate in a range of, e.g., about 1 to 2,000 sccm. The duration of a pulse in which the oxygen source 346 is introduced may be in a range of, e.g., about 0.01 to 100 seconds.

The nitrogen source 348 may include, e.g., $N_2$, $NH_3$, hydrazine ($N_2H_4$), monoalkyl hydrazine, dialkylhydrazine, $N_2$ plasma, remote $N_2$ plasma, or a combination thereof. The nitrogen source 348 may be introduced into the reaction space 312 at a flow rate in a range of, e.g., about 1 to about 2,000 sccm. The duration of a pulse in which the nitrogen source 348 is introduced may be within a range of, e.g., about 0.01 to about 100 seconds.

Figure 6:
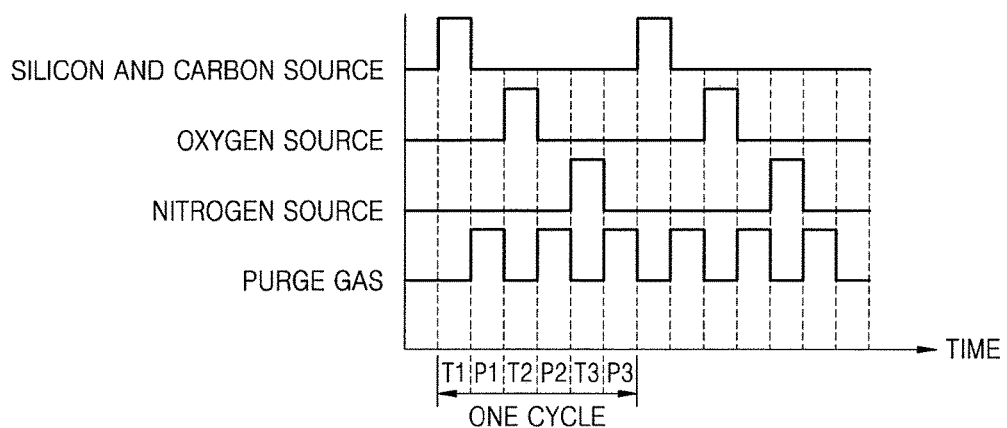
FIG. 6 illustrates a timing diagram of a supply cycle of process gases for forming a SiOCN material layer according to a method of manufacturing an integrated circuit device.

FIG. 6 illustrates a timing diagram of a supply cycle of process gases for forming a SiOCN material layer by an ALD process, according to an example embodiment.

Referring to FIGS. 5 and 6, the silicon and carbon source 344, the oxygen source 346, and the nitrogen source 348 may be sequentially supplied onto the substrate 110 in the reaction space 312. Before supplying the silicon and carbon source 344, before supplying the oxygen source 346 after supplying the silicon and carbon source 344, and before supplying the nitrogen source 348 after supplying the oxygen source 346, purge gas may be supplied onto the reaction space 312, respectively. The purge gas may include the same gas as the carrier gas 342. For example, the purge gas may be an inert gas such as He, Ne, or the like, or a gas with extremely low reactivity such as $N_2$ or $CO_2$. In an implementation, the purge gas may be supplied onto the reaction space 312 at a flow rate in a range of, e.g., about 10 to about 2,000 sccm for about 0.1 to about 1,000 seconds. By the supply of the purge gas, unreacted materials remaining in the reaction space 312 and undesirable by-products may be discharged out of or purged from the reaction chamber 310.

In an implementation, time T1 during which the silicon and carbon source 344 is supplied, time T2 during which the oxygen source 346 is supplied, and time T3 during which the nitrogen source 348 is supplied may be equal to each other, or at least one of the times T1, T2, and T3 may be different from each other. In an implementation, purge gas supply times P1, P2, and P3 may be equal to each other or at least one of the purge gas supply times P1, P2, and P3 may be different from each other.

One deposition cycle in which the silicon and carbon source 344, the oxygen source 346, and the nitrogen source 348 are sequentially supplied may be repeated a plurality of times until a SiOCN material layer of a desired thickness is obtained.

During at least one of a process of supplying the silicon and carbon source 344, a process of supplying the oxygen source 346, and a process of supplying the nitrogen source 348, the source gas may be activated by plasma. For example, when a temperature in the reaction chamber 310 is relatively low, it is possible to supply energy for forming the SiOCN material layer by supplying radio frequency (RF) power for plasma formation.

Referring again to FIG. 3C, the spacer layer 724 may include a SiOCN material layer formed by the method described with reference to FIGS. 4 to 6, and the SiOCN material layer constituting the spacer layer 724 may have a relatively high C content, e.g., about 14 to about 30 atomic %. Therefore, the spacer layer 724 may have excellent etching resistance to an oxide layer-etching atmosphere. If the C content of the SiOCN material layer constituting the spacer layer 724 were to be too low, it may be difficult to secure sufficient etching resistance of the spacer layer 724 while the spacer layer 724 experiences the oxide layer-etching atmosphere around the spacer layer 724 in subsequent processes.

In an implementation, the SiOCN material layer constituting the spacer layer 724 may have an O content of, e.g., about 32 to about 50 atomic %. Maintaining the O content in the SiOCN material layer constituting the spacer layer 724 at about 32 atomic % or greater may help ensure that a sufficiently low dielectric constant in the spacer layer 724 is secured. In an implementation, the SiOCN material layer constituting the spacer layer 724 may have a dielectric constant of about 3.5 to about 5.5, e.g., a dielectric constant of about 3.5 to about 4.8.

Figure 3D:
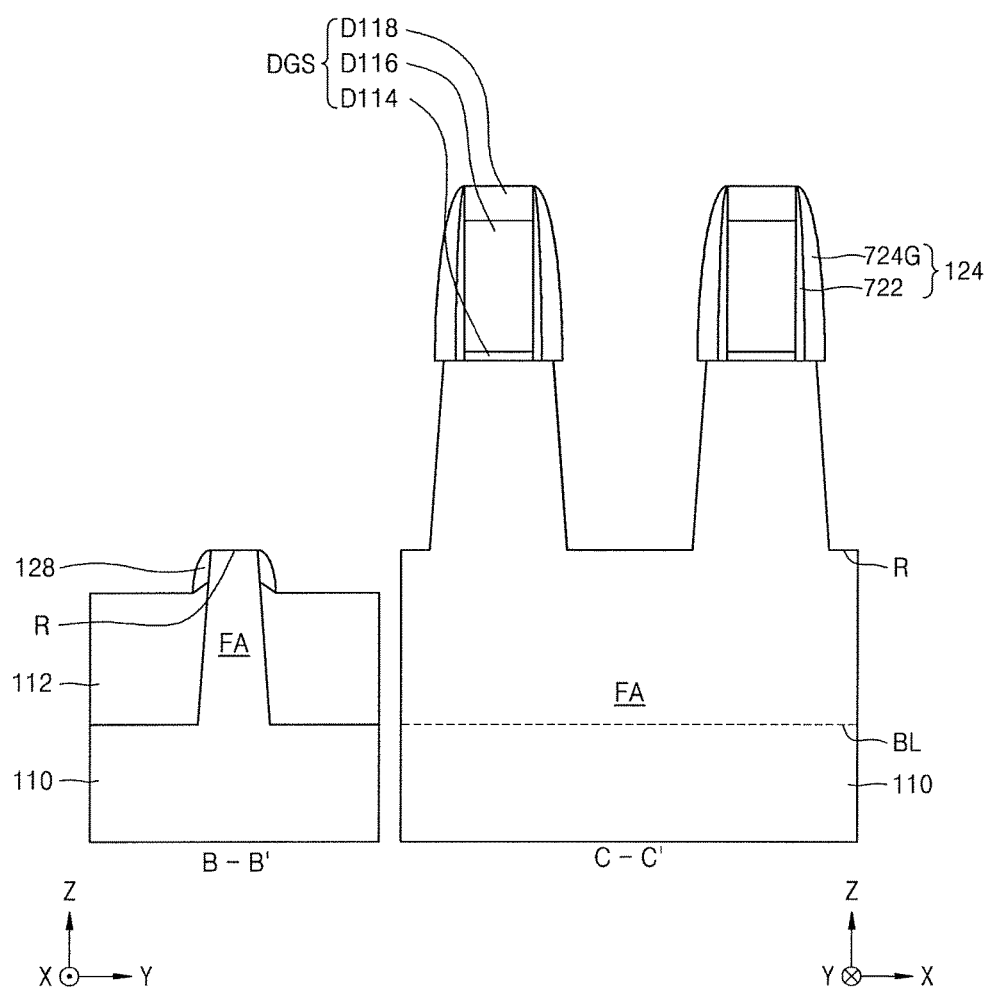

Referring to FIG. 3D, the spacer layer 724 may be partially etched to form an outer-gate insulating spacer 724G covering an inner-gate insulating spacer 722 on both sidewalls of each of the dummy gate structures DGS. The inner-gate insulating spacer 722 and the outer-gate insulating spacer 724G may constitute the gate insulating spacer 124. The fin-type active region FA may be exposed as the spacer layer 724 is etched to form the outer-gate insulating spacer 724G. The exposed fin-type active region FA may also be etched together with the spacer layer 724 to form the recess R in the fin-type active region FA, and a pair of fin insulating spacers 128 covering both sidewalls of the fin-type active region FA may be formed on both sides of the recess R. In an implementation, a sidewall of the recess R may be self-aligned to a sidewall of the outer-gate insulating spacer 724G and may extend in a depth direction of the fin-type active region FA. The dummy gate capping layer D118 of each of the dummy gate structures DGS (used as an etch mask during the etching of the fin-type active region FA to form the recess R) may be consumed and a thickness of the dummy gate capping layer D118 may be reduced.

A dry etching process or a wet etching process of the spacer layer 724 and the fin-type active region FA, or a combination thereof, may be used to form the outer-gate insulating spacer 724G, the fin insulating spacer 128, and the recess R.

Thereafter, it is possible to remove a native oxide layer on a surface of the recess R. In order to remove the native oxide layer on the surface of the recess R, a first cleaning process for exposing the surface of the recess R to DHF (diluted HF), and a second cleaning process for exposing the surface of the recess R to hydrogen plasma and fluorine plasma which are by-products of $NF_3$ and $NH_3$ plasma using a remote plasma system, and a third etching process for removing the native oxide layer remaining on the surface of the recess R by baking the surface of the recess R under a hydrogen ($H_2$) atmosphere may be sequentially performed.

In an implementation, the baking process under the hydrogen atmosphere may be performed, e.g., for about 5 seconds to about 1 minute, under an atmosphere of a relatively high temperature, e.g., of about 700° C. to about 800° C., and a pressure of, e.g., about 1 to about 20 torr. In an implementation, the baking process in the hydrogen atmosphere may be performed under a mixed gas atmosphere of $H_2$ gas and an inert gas such as argon (Ar), He, Ne, or $N_2$. In an implementation, the hydrogen gas may be included in an amount of, e.g., about 5% to about 30% by volume in the mixed gas atmosphere.

During the baking process under the hydrogen atmosphere, the remaining native oxide layer on the surface of the recess R may be removed and hydrogen-enhanced surface atom migration may be induced at the surface of the recess R. Therefore, a surface roughness of the recess R may be reduced and surface morphology of the recess R may be changed, such that the recess R having a smooth surface may be obtained.

In an implementation, when a silicon oxide layer conformally covering the spacer layer 724 is further formed on the spacer layer 724 in the process described with reference to FIG. 3C, the silicon oxide layer may be gradually removed while being exposed to the atmosphere of the first to third cleaning processes. As a result, during the first to third cleaning processes, at least a portion of the outer-gate insulating spacer 724G and the fin insulating spacer 128 may be exposed to the atmosphere of the first to third cleaning processes. In an implementation, when the silicon oxide layer is not formed on the spacer layer 724 in the process described with reference to FIG. 3C, the outer-gate insulating spacer 724G and the fin insulating spacer 128 may also be exposed to the atmosphere of the first to third cleaning processes in the same manner as the surface of the recess R.

As described above, during the first to third cleaning processes, the outer-gate insulating spacer 724G and the fin insulating spacer 128 in addition to the surface of the recess R may also be exposed to the atmosphere of the first to third cleaning processes. However, the outer-gate insulating spacer 724G and the fin insulating spacer 128 may be formed of the SiOCN material layer formed by the method described above with reference to FIGS. 4 to 6, and the C content of the SiOCN material layer constituting the outer-gate insulating spacer 724G and the fin insulating spacer 128 may be relatively high, e.g., at about 14 to about 30 atomic %. Therefore, etching resistance against the oxide layer-etching atmosphere may be improved, such that the outer-gate insulating spacer 724G and the fin insulating spacer 128 may be prevented from being consumed by the atmosphere of the first to third cleaning processes as the first to third cleaning processes are performed.

For example, the outer-gate insulating spacer 724G and the fin insulating spacer 128 may also be exposed to a baking process atmosphere (under the hydrogen atmosphere) while performing the baking process under the hydrogen atmosphere under at a relatively high temperature of about 700° C. to about 800° C. in the third cleaning process. If a SiOCN material layer were to be formed using a precursor having no bond between Si atom and C atom, such as hexachlorodisilane (HCC, $Si_2Cl_6$), it may be difficult to secure a C content that is sufficiently high to form to form a SiOCN material layer having a desired low dielectric constant. In addition, a bond of C atoms in the conventional SiOCN material layer may be unstable, and the C atoms may be outgassed from the SiOCN material layer while performing the baking process under the hydrogen atmosphere at the relatively high temperature. The C atoms released to the outside of the conventional SiOCN material layer by the outgassing may be adsorbed on a surface of the recess R. If the C atoms were to be adsorbed on the surface of the recess R, the native oxide layer may not be removed from the surface of the recess R due to the adsorbed C atoms, even if the baking process is performed under the hydrogen atmosphere at the relatively high temperature. In addition, if the C atoms were to exist on the surface of the recess R, the C atoms could act as defects and may deteriorate electrical characteristics of the source/drain region 130 when performing an epitaxial growth process for forming the source/drain region 130 on the surface of the recess R in subsequent processes.

In a method according to example embodiments, a precursor having a structure in which Si atom and C atom are directly bonded to each other by chemical bonding may be used when forming the SiOCN material layer constituting the outer-gate insulating spacer 724G and the fin insulating spacer 128. Therefore, the C atoms may exist in a stable bonding state together with the Si atoms in the SiOCN material layer. As a result, when performing the baking process under the hydrogen atmosphere at a relatively high temperature, outgassing of the C atoms from the SiOCN material layer constituting the outer-gate insulating spacer 724G and the fin insulating spacer 128 may be suppressed even if the outer-gate insulating spacer 724G and the fin insulating spacer 128 undergo the baking process under the hydrogen atmosphere. Therefore, the SiOCN material layer constituting the outer-gate insulating spacer 724G and the fin insulating spacer 128 may have a C content that is sufficient to secure desired etching resistance to the oxide layer-etching atmosphere. For example, the sufficient C content may be about 14 to about 30 atomic %. In an implementation, the outgassing of the C atoms from the SiOCN material layer may be suppressed, the native oxide layer may be easily removed from the surface of the recess R, and a clean and smooth surface of the recess R may be obtained.

Figure 3E:
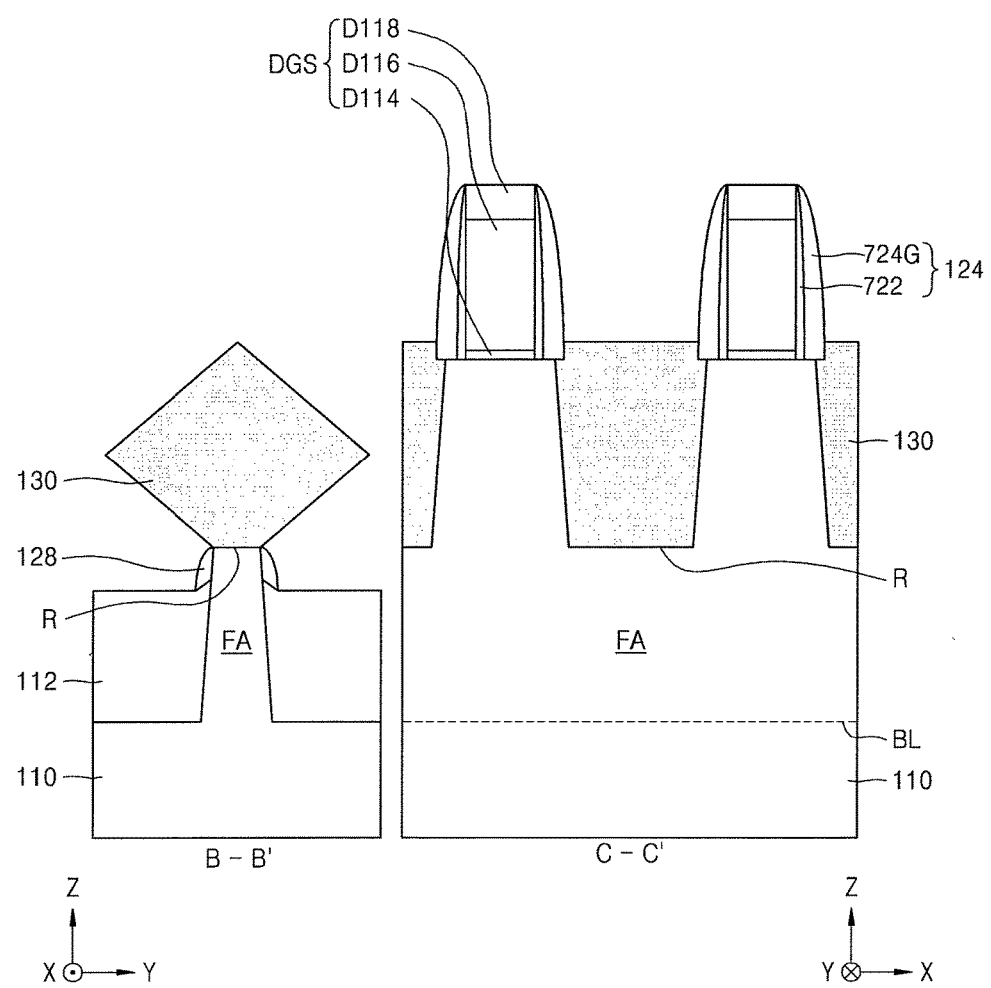

Referring to FIG. 3E, a plurality of source/drain regions 130 may be formed by growing a semiconductor layer, via the epitaxial growth process, from the surface of the fin-type active region FA exposed through the recess R.

In an implementation, a process of growing a semiconductor layer in the recess R may be performed in situ with the third cleaning process described with reference to FIG. 3D immediately after removing the native oxide layer from the surface of the recess R without breaking the vacuum atmosphere maintained in the third cleaning process.

Figure 3F:
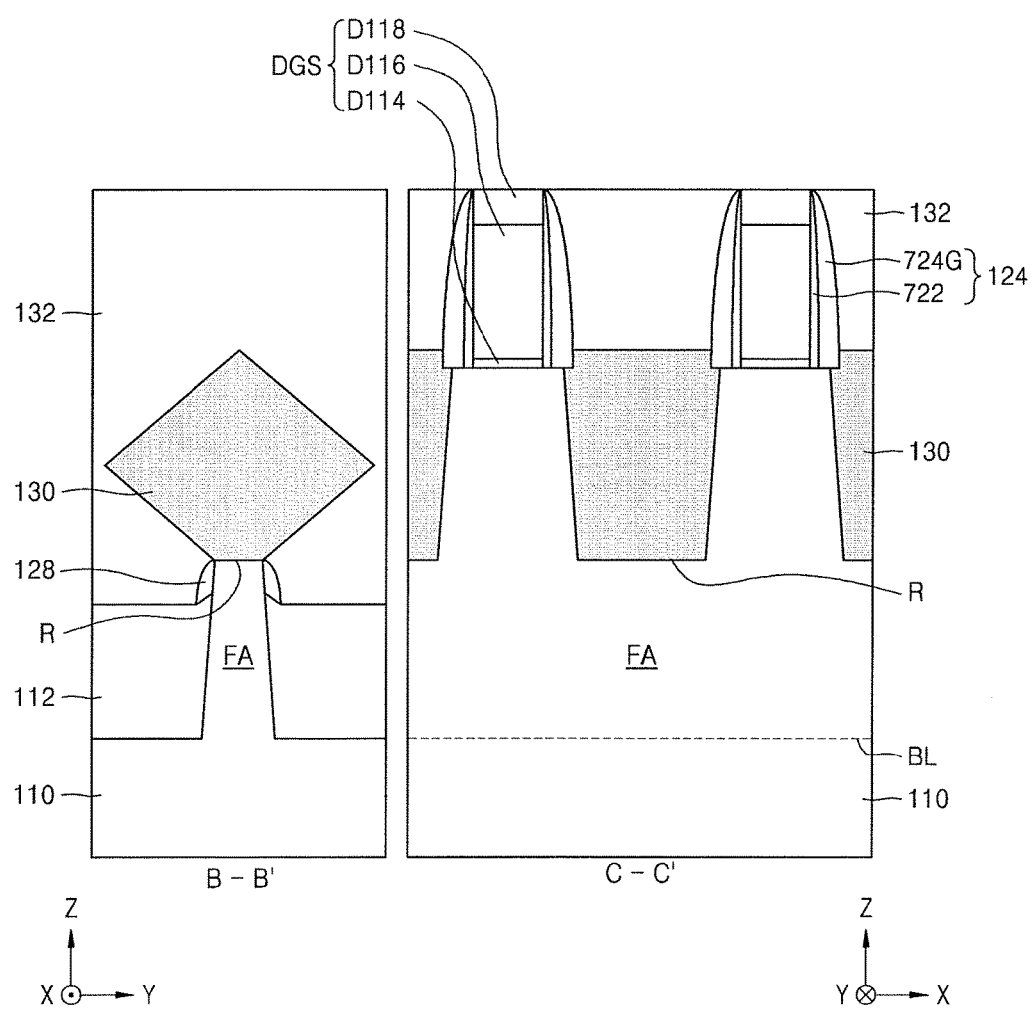

Referring to FIG. 3F, the plurality of source/drain regions 130, the plurality of dummy gate structures DGS, and the inter-gate insulating layer 132 covering the gate insulating spacers 124 may be formed.

In an example of forming of the inter-gate insulating layer 132, an insulating layer of a sufficient thickness may cover the plurality of source/drain regions 130, the plurality of dummy gate structures DGS, and the gate insulating spacers 124. Thereafter, the inter-gate insulating layer 132 having a planarized upper surface may be formed by planarizing a resultant product in which the insulating layer is formed such that upper surfaces of the plurality of dummy gate structures DGS are exposed.

Figure 3G:
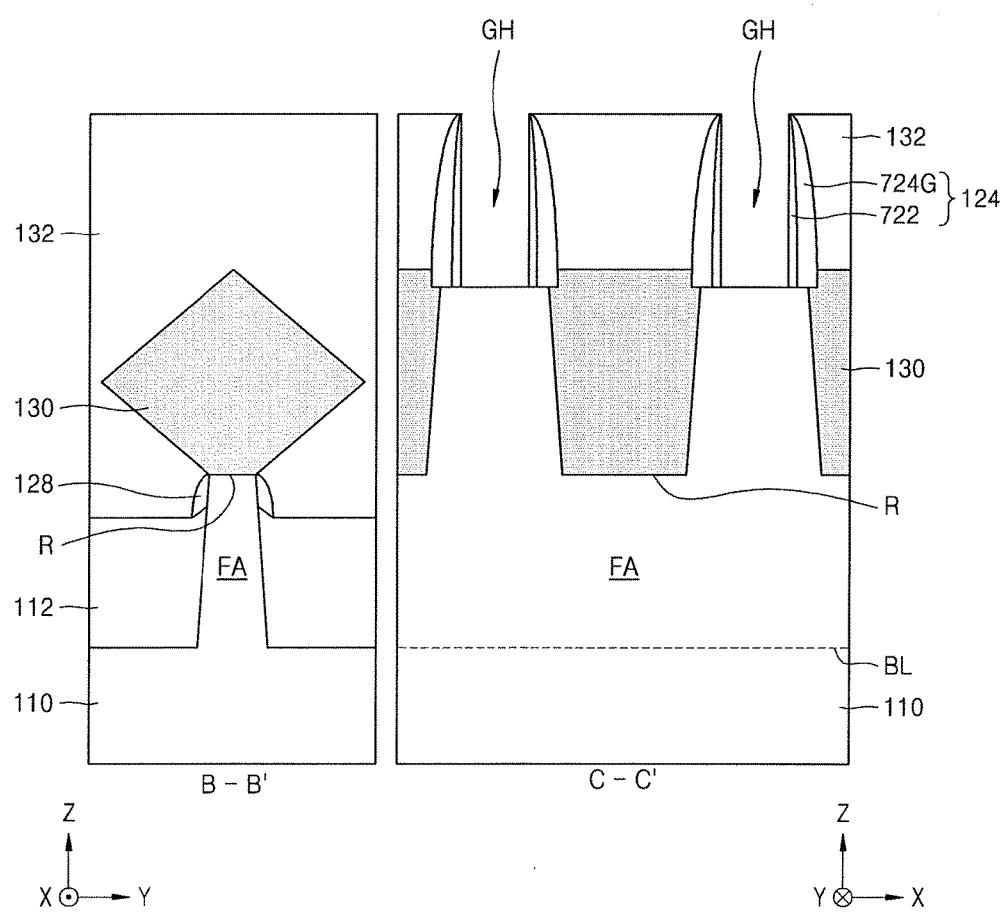

Referring to FIG. 3G, the plurality of dummy gate structures DGS exposed through the inter-gate insulating layer 132 may be removed to form gate spaces GH. The gate insulating spacers 124 and the fin-type active region FA may be exposed through the gate spaces GH.

Figure 3H:
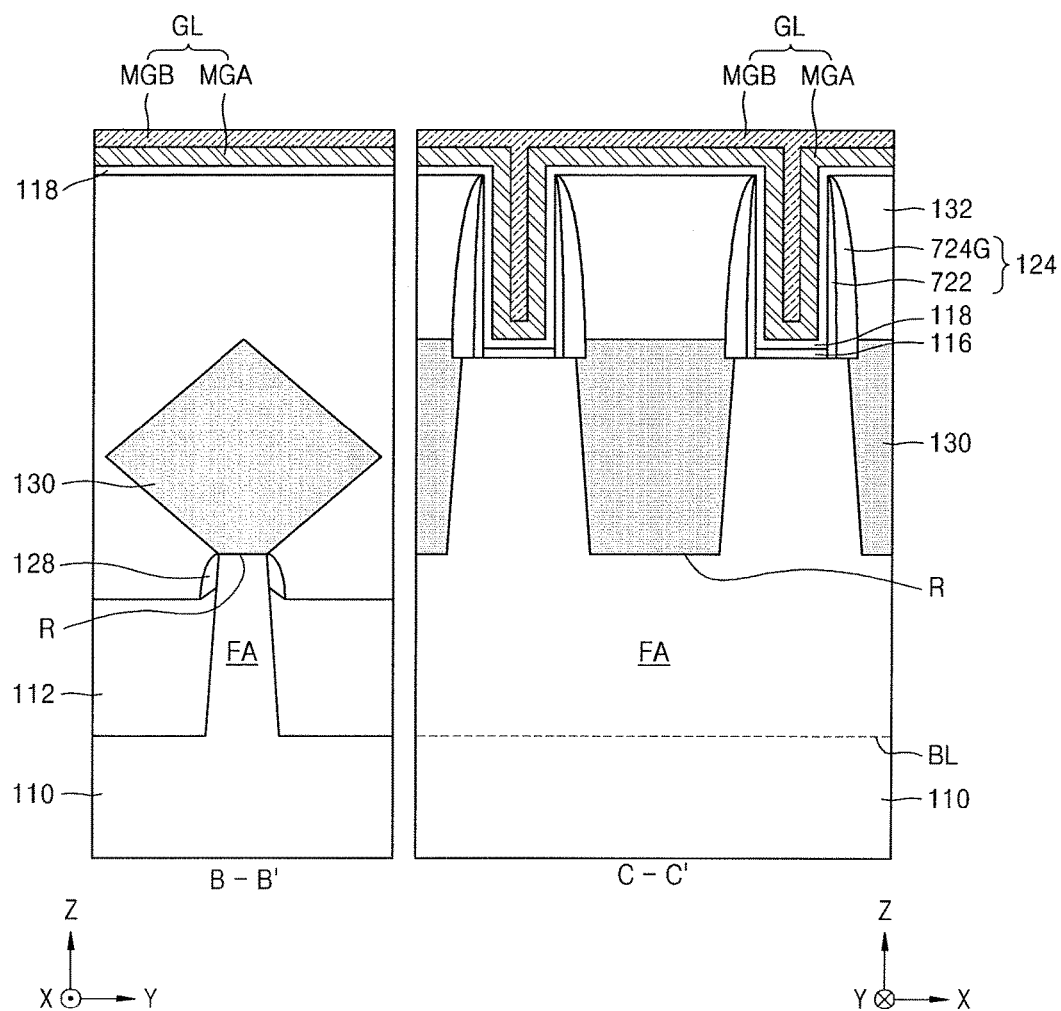

Referring to FIG. 3H, the interface layers 116, the gate insulating layers 118, and the gate lines GL may be formed in the gate spaces GH (see FIG. 3G).

In an example of forming of the interface layers 116, portions of the fin-type active region FA exposed in the gate spaces GH (see FIG. 3G) may be oxidized.

The gate insulating layers 118 and the gate lines GL may cover an upper surface of the inter-gate insulating layer 132 while filling the gate spaces GH (see FIG. 3G). The gate insulating layers 118 may be formed by, e.g., an ALD process, a chemical vapor deposition (CVD) process, or a physical vapor deposition (PVD) process.

The gate lines GL may be formed to a thickness sufficient to fill the gate spaces GH. Each of the gate lines GL may include the first metal-containing layer MGA and the second metal-containing layer MGB. As for details of the first metal-containing layer MGA and the second metal-containing layer MGB, refer to the descriptions described in detail with reference to FIGS. 2A to 2D. The ALD, CVD, or PVD process may be used to form the gate lines GL.

Figure 3I:
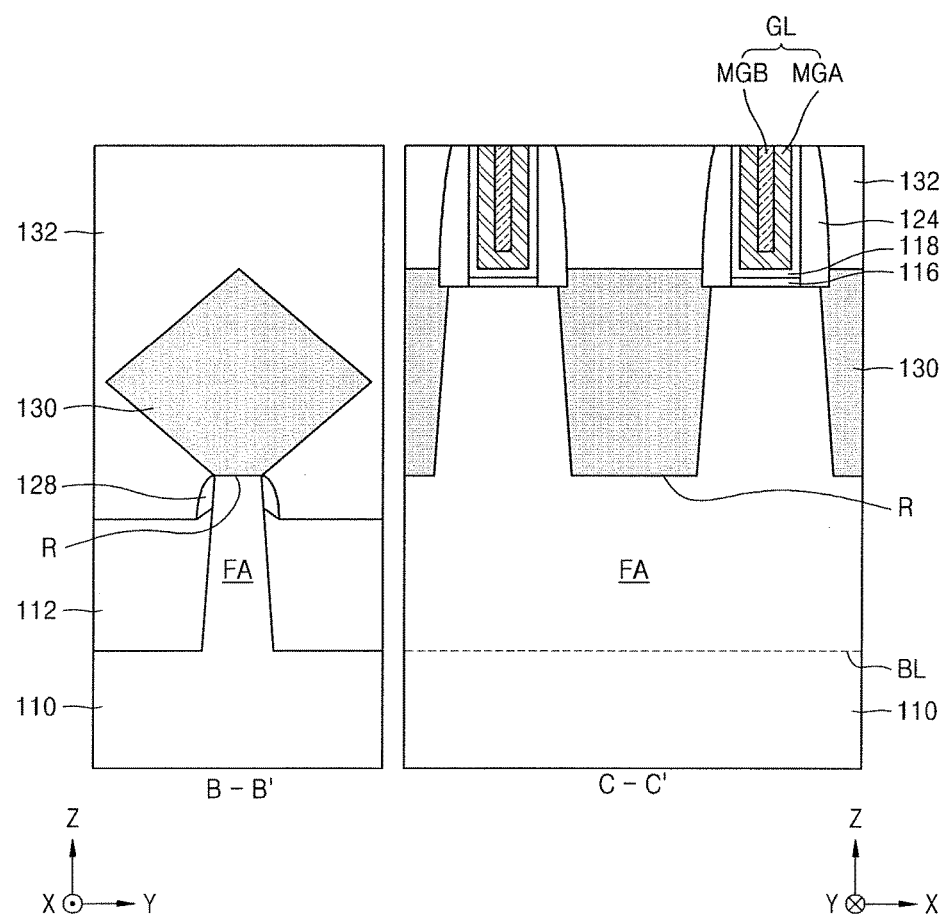

Referring to FIG. 3I, unnecessary portions may be removed by a planarization process with respect to the result of FIG. 3H, such that the gate lines GL and the gate insulating layers 118 may be left in the gate spaces GH.

As a result of the planarization process, a predetermined thickness of each of the gate insulating spacers 124 and the inter-gate insulating layer 132 may be consumed from respective upper surfaces, such that heights along the Z direction, e.g., thicknesses in a vertical direction of the gate insulating spacers 124 and the inter-gate insulating layer 132, may be reduced. In addition, upper surfaces of the gate insulating layers 118, upper surfaces of the gate insulating spacers 124, and an upper surface of the inter-gate insulating layer 132 may be exposed around upper surfaces of the gate insulating layers GL.

Figure 3J:
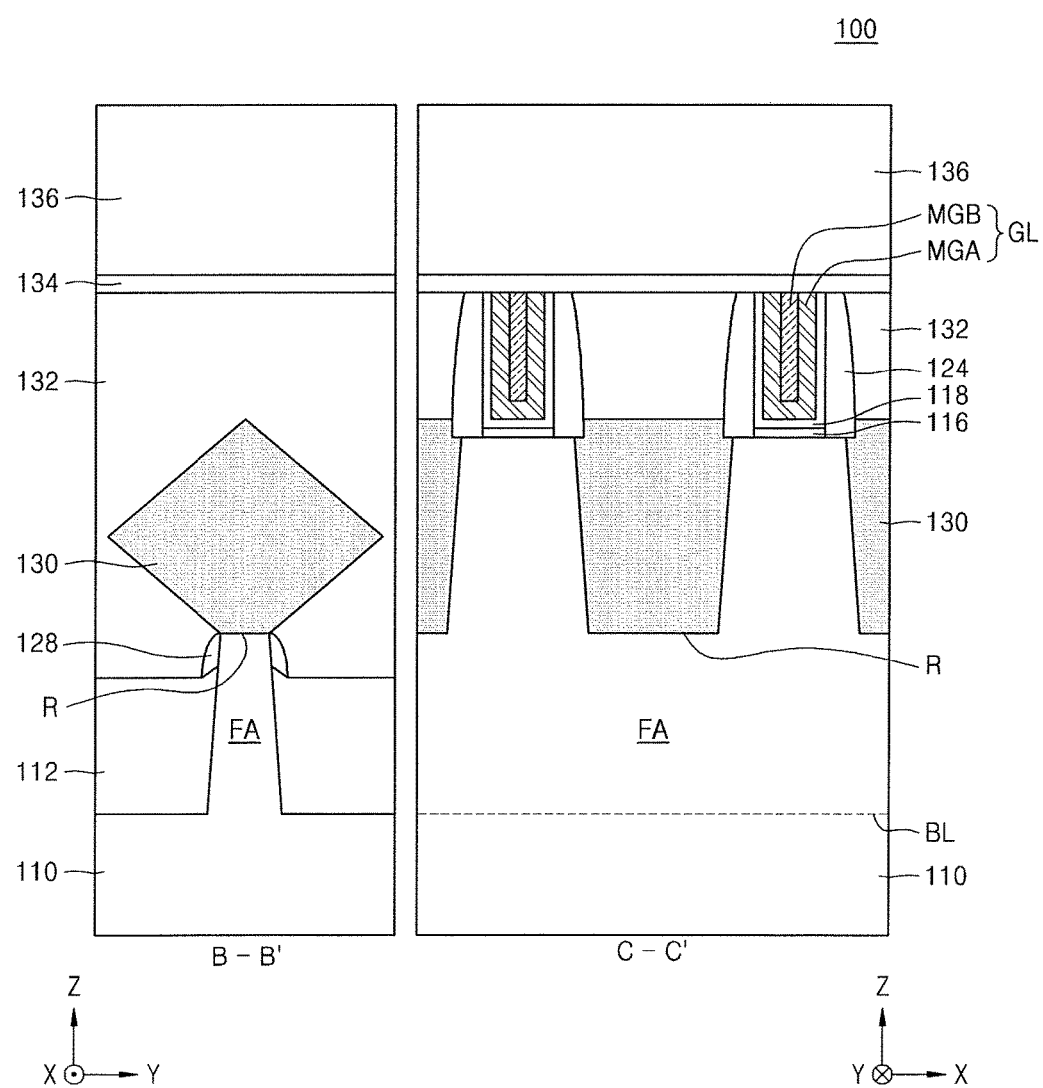

Referring to FIG. 3J, the blocking insulating layer 134 and the interlayer insulating layer 136 may be sequentially formed to cover the upper surface of the gate lines GL and the upper surface of the inter-gate insulating layer 132.

In an implementation, a mask pattern may be formed on the interlayer insulating layer 136 as desired, and then the interlayer insulating layer 136, the blocking insulating layer 134, and the inter-gate insulating layer 132 may be sequentially etched using the mask pattern as an etching mask to form contact holes passing through the interlayer insulating layer 136, the blocking insulating layer 134, and the inter-gate insulating layer 132 pass. In an implementation, source/drain contact plugs electrically connected to the plurality of source/drain regions 130 may be formed by filling the contact holes with a conductive material.

In the method of manufacturing an integrated circuit device described with reference to FIGS. 3A to 6, a precursor having a bond between Si atom and C atom may be used when forming the SiOCN material layer constituting the outer-gate insulating spacer 724G and the fin insulating spacer 128. Therefore, the C atoms may exist in a stable bonding state in the SiOCN material layer, and as a result, when performing the baking process in the hydrogen atmosphere in an atmosphere of a relatively high temperature of about 700° C. to about 800° C., undesirable outgassing of the C atoms from the SiOCN material layer (constituting the outer-gate insulating spacer 724G and the fin insulating spacer 128) may be suppressed, even if the outer-gate insulating spacer 724G and the fin insulating spacer 128 undergo the baking process under the hydrogen atmosphere. In an implementation, the SiOCN material layer constituting the outer-gate insulating spacer 724G and the fin insulating spacer 128 may have a C content that is sufficient to secure desired etching resistance to the oxide layer-etching atmosphere. For example, the sufficient C content may be about 14 to about 30 atomic %. In an implementation, the outgassing of the C atoms from the SiOCN material layer may be suppressed, the native oxide layer may be easily removed from the surface of the recess R, and the source/drain region 130 may be formed by an epitaxial growth process from a clean and smooth surface of the recess R. For example, it is possible to manufacture an integrated circuit device having excellent electrical characteristics and improved reliability by including the outer-gate insulating spacer 724G and the fin insulating spacer 128 including a SiOCN material layer having a sufficiently low dielectric constant and excellent etching resistance.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Evaluation Example

According to the method of manufacturing an integrated circuit device described herein, a SiOCN material layer was formed on a substrate by using a precursor having a bond between Si atom and C atom. The obtained SiOCN material layer was baked under the hydrogen atmosphere in the same manner as described with reference to FIG. 3D, and a content of chemical elements constituting the baked SiOCN material layer was analyzed.

For this evaluation, a PEALD process was performed at a deposition temperature of 450° C. using 1,1,3,3-tetramethyl-1,3-disilacyclobutane ($C_6H_{16}Si_2$) as a Si source, $C_3H_6$ as a C source, $O_2$ as a O source, and $NH_3$ as an N source to form the SiOCN material layer. The resultant SiOCN material layer was baked under a hydrogen atmosphere at a temperature of 600° C.

As a result of analyzing the content of the chemical elements constituting the baked SiOCN material layer as described above, it was found that a Si content was about 33.9 atomic %, an O content was about 28.8 atomic %, a C content was about 16.1 atomic %, and an N content was about 21.1 atomic % in the baked SiOCN material layer. From these results, it was found that the C content in the baked SiOCN material layer was maintained at a relatively high content of about 16.1 atomic %.

As a Comparative Example, a similar evaluation was performed on another SiOCN material layer obtained by using a precursor having no bond between Si atom and C atom. After performing a PEALD process using HCD ($Si_2Cl_6$) as the Si source, $C_3H_6$ as the C source, $O_2$ as the O source, and $NH_3$ as the N source to form a comparative SiOCN material layer, the comparative SiOCN material layer was baked under a hydrogen atmosphere at a temperature of 600° C. In the baked comparative SiOCN material layer, the Si content was about 36.5 atomic %, the O content was about 32.1 atomic %, the C content was about 9.8 atomic %, and the N content was about 21.6 atomic %. From these results, it can be seen that the C content was significantly lower in the baked comparative SiOCN material layer than in the SiOCN material layer formed by the exemplary method. This may be attributed to presence or absence of a Si—C bond in the SiOCN material layer. In the SiOCN material layer formed by the exemplary method, the C atoms were in a stable state due to the Si—C bond in the SiOCN material layer, and as a result, outgassing of the C atoms from the SiOCN material layer was effectively suppressed during the baking process, even though the baking process was performed at a relatively high temperature under a hydrogen atmosphere.

By way of summation and review, it may be difficult to increase, to a desired range, the content of main chemical elements, which play a role in securing a low dielectric constant among chemical elements constituting the low dielectric layer. Furthermore, characteristics of the low dielectric layer could deteriorate because the main chemical elements exist in an unstable bonding state in the low dielectric layer and may be outgassed to the outside of the low dielectric layer during a subsequent process. In addition, an undesired process failure may be caused due to the outgassed main chemical elements.

In a method of manufacturing an integrated circuit device according to an embodiment, it is possible to manufacture an integrated circuit device having excellent electrical characteristics and improved reliability by including a SiOCN material layer having a sufficiently low dielectric constant and excellent etching resistance.

The embodiments may provide a method of manufacturing an integrated circuit device including a stable low dielectric layer.

The embodiments may provide a method of manufacturing an integrated circuit device capable of forming a low dielectric layer including a desired content of main chemical elements by maintaining the main chemical elements in a stable state, wherein the main chemical elements play a role in securing a low dielectric constant in the low dielectric layer, and providing improved electrical characteristics accordingly.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
   forming a silicon oxycarbonitride (SiOCN) material layer on an active region of a substrate, the forming the SiOCN material layer including using a precursor that has a bond between a silicon (Si) atom and a carbon (C) atom;
   etching a portion of the active region to form a recess in the active region;
   baking a surface of the recess at about 700° C. to about 800° C. under a hydrogen ($H_2$) atmosphere, and exposing the SiOCN material layer to the atmosphere of the baking while performing the baking; and
   growing a semiconductor layer from the surface of the recess baked under the hydrogen atmosphere,
   wherein forming the SiOCN material layer includes performing an atomic layer deposition (ALD) process including repeating a single deposition cycle a plurality of times, the single deposition cycle including sequentially performing:

a first operation of supplying the precursor onto the substrate, a second operation of supplying an oxygen source onto the substrate, and a third operation of supplying a nitrogen source onto the substrate.

2. The method as claimed in claim 1, wherein, in the forming of the SiOCN material layer, a C content of the SiOCN material layer is about 14 to about 30 atomic %.

3. The method as claimed in claim 1, wherein forming the SiOCN material layer is performed at a temperature of about 450° C. to about 800° C.

4. The method as claimed in claim 1, wherein the precursor includes a compound having no Si—Si bond.

5. The method as claimed in claim 1, wherein the precursor includes a compound including a single bond between Si atom and C atom, a compound including a double bond between Si atom and C atom, or a compound including a triple bond between Si atom and C atom.

6. The method as claimed in claim 1, wherein the precursor includes a compound having a plurality of bonds between Si atom and C atom.

7. The method as claimed in claim 1, wherein the precursor includes a compound represented by one of the following Formulae 1 and 2:

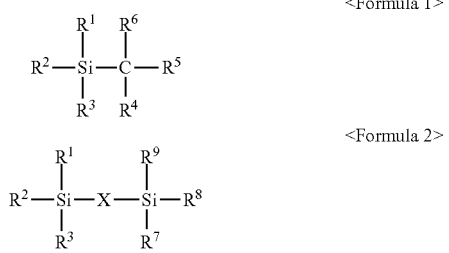

wherein, $R^1$ to $R^9$ are each independently an H atom, a Cl atom, a C1-C3 alkyl group, or a cyano group, and X is a C1-C3 alkyl group, a C2-C3 alkenyl group, a C2-C3 alkynyl group, or a carbonyl group.

8. The method as claimed in claim 1, wherein the precursor includes a cyclic compound in which at least one Si atom and at least one C atom together are part of a ring.

9. The method as claimed in claim 1, further comprising removing a native oxide layer from the surface of the recess after baking the surface of the recess, wherein growing the semiconductor layer from the surface of the recess is performed in-situ with the removal of the native oxide layer from the surface of the recess after removal of the native oxide layer.

10. An integrated circuit device prepared according to the method as claimed in claim 1.

11. A method of manufacturing an integrated circuit device, the method comprising:

etching a portion of a substrate to form a fin-type active region;

forming a silicon oxycarbonitride (SiOCN) material layer that covers the fin-type active region on the substrate, the forming the SiOCN material layer including using a precursor that has a bond between a silicon (Si) atom and a carbon (C) atom and that does not have a Si—Si bond;

etching a portion of the fin-type active region while etching the SiOCN material layer to form a recess in the fin-type active region while forming a gate insulating spacer from the SiOCN material layer on the fin-type active region;

baking a surface of the recess at about 700° C. to about 800° C. under a hydrogen ($H_2$) atmosphere, and exposing the gate insulating spacer to the atmosphere of the baking while performing the baking;

growing a semiconductor layer from the surface of the recess baked under the hydrogen atmosphere; and forming a gate line on the fin-type active region such that the gate line has a sidewall facing the gate insulating spacer, wherein, in forming the SiOCN material layer, a C content of the SiOCN material layer is about 14 to about 30 atomic %.

12. The method as claimed in claim 11, further comprising:

forming a fin insulating spacer covering both sidewalls of a portion of the fin-type active region where the recess is formed such that the fin insulating spacer is formed from the SiOCN material layer during the formation of the recess in the fin-type active region; and exposing the fin insulating spacer to the atmosphere of the baking while performing the baking.

13. The method as claimed in claim 11, wherein the precursor includes a compound including at least one of a Si—C—Si bond group and a C—Si—C bond group.

14. The method as claimed in claim 11, wherein the precursor includes a cyclic compound in which at least one Si atom and at least one C atom together are part of a ring.

15. An integrated circuit device prepared according to the method as claimed in claim 11.

16. A method of manufacturing an integrated circuit device, the method comprising:

providing a substrate that has an active region;

forming a silicon oxycarbonitride (SiOCN) material layer on the active region of the substrate such that the SiOCN material layer is formed using a precursor that has a direct bond between a silicon (Si) atom and a carbon (C) atom of the precursor;

etching a portion of the active region to form a recess in the active region;

baking a surface of the recess at about 700° C. to about 800° C. under a hydrogen ($H_2$) atmosphere such that the SiOCN material layer is exposed to the atmosphere of the baking while performing the baking; and growing a semiconductor layer from the baked surface of the recess, wherein the precursor includes:

a cyclic compound in which at least one Si atom and at least one C atom together are part of a ring, or a compound represented by one of the following Formulae 1 and 2:

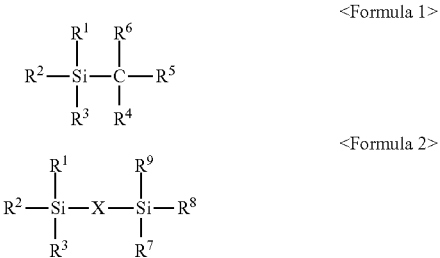

wherein, in Formula 1 and 2, $R^1$ to $R^9$ are each independently an H atom, a Cl atom, a C1-C3 alkyl group, or a cyano group, and X is a C1-C3 alkyl group, a C2-C3 alkenyl group, a C2-C3 alkynyl group, or a carbonyl group.

17. The method as claimed in claim 16, wherein the SiOCN material layer has a carbon content of about 14 to about 30 atomic %.

18. An integrated circuit device prepared according to the method as claimed in claim 16.

* * * * *